United States Patent
Pamulaparthy et al.

(10) Patent No.: US 11,733,301 B2
(45) Date of Patent: Aug. 22, 2023

(54) SYSTEMS AND METHODS FOR PROVIDING VOLTAGE-LESS ELECTRICAL SIGNATURE ANALYSIS FOR FAULT PROTECTION

(71) Applicant: General Electric Technology GmbH, Baden (CH)

(72) Inventors: Balakrishna Pamulaparthy, Hyderabad (IN); Mitalkumar Kanabar, Markham (CA); Akilezkrishnamurthy Arthanari, Markham (CA)

(73) Assignee: General Electric Technology GmbH, Baden (CH)

( * ) Notice: Subject to any disclaimer, the term of this patent is extended or adjusted under 35 U.S.C. 154(b) by 88 days.

(21) Appl. No.: 17/359,437

(22) Filed: Jun. 25, 2021

(65) Prior Publication Data
US 2022/0373599 A1    Nov. 24, 2022

(51) Int. Cl.
G01P 21/02 (2006.01)
G01R 31/34 (2020.01)

(52) U.S. Cl.
CPC .................................. *G01R 31/343* (2013.01)

(58) Field of Classification Search
CPC .................................................. G01R 31/343
See application file for complete search history.

(56) References Cited

U.S. PATENT DOCUMENTS

| | | | |
|---|---|---|---|
| 6,308,140 B1 | 10/2001 | Dowling et al. | |
| 6,449,567 B1 | 9/2002 | Desai et al. | |
| 6,727,725 B2 | 4/2004 | Devaney et al. | |
| 6,774,601 B2 | 8/2004 | Schwartz et al. | |
| 6,941,785 B2 | 9/2005 | Haynes et al. | |
| 7,081,760 B2 | 7/2006 | Mirafzal et al. | |
| 7,099,852 B2 | 8/2006 | Unsworth et al. | |
| 7,346,475 B2 | 3/2008 | Dimino et al. | |

(Continued)

FOREIGN PATENT DOCUMENTS

| | | |
|---|---|---|
| EP | 2743669 A1 | 6/2014 |
| EP | 3068040 A1 | 9/2016 |

(Continued)

OTHER PUBLICATIONS

An Improved Rotor Flux Space Vector Based MRAS for Field-Oriented Control of Induction Motor Drives, Pal et al., Jun. 2018 (Year: 2018).*

Using A Six Fault Zone Approach for Predictive Maintenance on Motors, McKinnon Oct. 2007 (Year: 2007).*

(Continued)

*Primary Examiner* — Alesa Allgood
(74) *Attorney, Agent, or Firm* — Eversheds Sutherland (US) LLP

(57) ABSTRACT

Systems and methods are disclosed for voltage-less electrical signature analysis for fault protection. The systems and methods described herein may involve determining voltage values for a motor (which may then be used to estimate a speed of the motor) when complete voltage measurements may not be available, or may only be temporarily available. More specifically, the systems and methods described herein may address three scenarios, which may include at least: (1) when only a single phase voltage input is available for a three-phase motor, (2) when no voltage input is available, or (3) when a voltage input is only available for a limited period of time (for example, during a learning phase of the motor).

20 Claims, 8 Drawing Sheets

(56) References Cited

U.S. PATENT DOCUMENTS

| | | | |
|---|---|---|---|
| 8,135,551 B2 | 3/2012 | Tiwari et al. | |
| 8,994,359 B2 | 3/2015 | Neti et al. | |
| 9,618,583 B2 | 4/2017 | Liu et al. | |
| 2005/0021301 A1* | 1/2005 | Dimino | H02H 7/0822 |
| | | | 702/185 |
| 2011/0050142 A1* | 3/2011 | Lu | H02P 27/045 |
| | | | 702/145 |
| 2014/0303913 A1 | 10/2014 | Neti et al. | |
| 2015/0260794 A1* | 9/2015 | Athikessavan | G01R 31/343 |
| | | | 702/58 |
| 2016/0282416 A1 | 9/2016 | Choi et al. | |
| 2017/0052208 A1* | 2/2017 | Reddy | G01P 21/02 |

FOREIGN PATENT DOCUMENTS

| | | |
|---|---|---|
| WO | 2011158099 A2 | 12/2011 |
| WO | 2015047121 A1 | 4/2015 |
| WO | 2019167086 A1 | 9/2019 |

OTHER PUBLICATIONS

Pal et al.: An Improved Rotor Flux Space Vector Based MRAS for Field-Oriented Control of Induction Motor Drives. IEEE Transactions on Power Electronics, vol. 33, No. 6, Jun. 1, 2018, pp. 5131-5141.

McKinnon: Using a six fault zone approach for predictive maintenance on motors. 2007 Electrical Insulation Conference and Electrical Manufacturing Expo, Oct. 22, 2007, pp. 253-264.

Extended European Search Report issued in EP Application No. 22172560.9 dated Sep. 27, 2022, 12 pages.

\* cited by examiner

SYSTEMS AND METHODS FOR PROVIDING VOLTAGE-LESS ELECTRICAL SIGNATURE ANALYSIS FOR FAULT PROTECTION

CROSS-REFERENCE TO RELATED APPLICATIONS

This application claims the priority benefit of Indian Application No. 202141021634, filed May 13, 2021, which is incorporated herein, in its entirety, by reference.

TECHNICAL FIELD

The disclosure relates to power systems, and, more particularly to, systems and methods for providing voltage-less electrical signature analysis for fault detection.

BACKGROUND

Rotating machines are frequently integrated in commercially available equipment and industrial processes. The health condition of a rotating machine can be effectively monitored using a non-intrusive method called electrical signature analysis (ESA). The concept is to treat the rotating machine as an implicit transducer built into machine-driven equipment; the current behavior can thus be used to show various health conditions of the machine as well as the load it is driving. Motor protection relays may use current transformer (CT) and power transformer (PT) inputs for protection, control, and monitoring. In certain installations, however, a corresponding voltage transformer (VT) input may not be available, which may make ESA and speed estimations for a motor more difficult. This may occur, for example, when a VT is not installed on the motor terminal; if there is only one VT for entire supply feeder; if a VT is provided, but is malfunctioning; or if a VT is provided, but is provided on the bus side of a variable frequency drive (VFD) fed motor.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Figure 1:
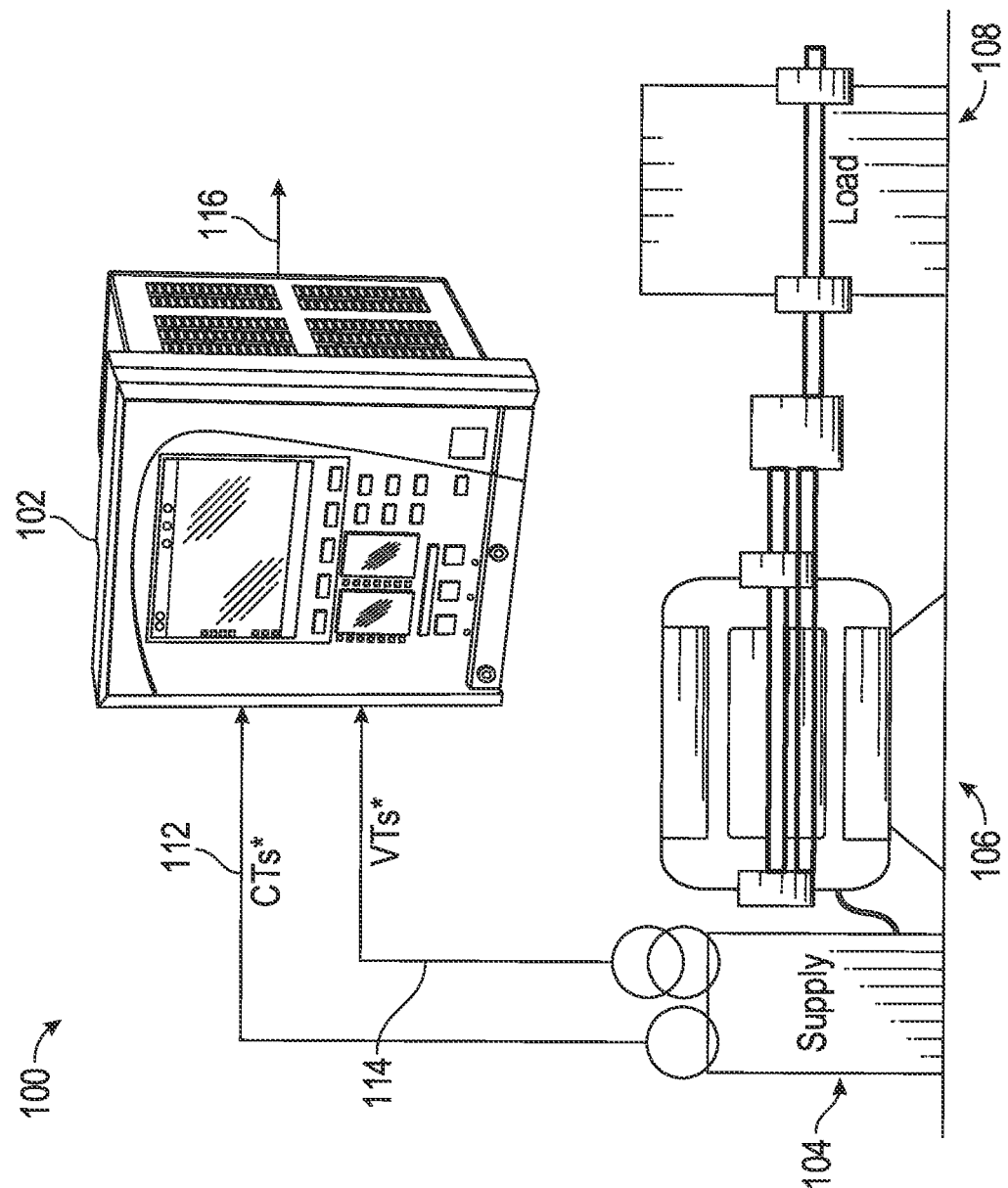
FIG. 1 depicts a schematic illustration of an example system, in accordance with one or more example embodiments of the disclosure.

This disclosure may relate to, among other things, voltage-less electrical signature analysis for fault protection using a protection relay. That is, in some cases, the operations described herein may be performed using the protection relay. However, in other cases, the operations may also be performed using any other device or system, such as a remote system. The systems and methods described herein may involve determining voltage values for a motor (which may then be used to estimate a speed of the motor) when complete voltage measurements may not be available, or may only be temporarily available. More specifically, the systems and methods described herein may address certain scenarios, which may include at least: (1) when only a single phase voltage input is available for a three-phase motor, (2) when no voltage input is available, or (3) when a voltage input is only available for a limited period of time (for example, during a learning or installation phase of the motor or relay). At a high level, the first scenario may be addressed by performing pseudo-voltage calculations by assuming that the magnitude of the three phases may be the same and the three phases may be separated by an equal number of degrees (for example, 120 degrees). The second scenario may be addressed by estimating the speed of the motor using load data and a rated current and/or speed of the motor. The third scenario may be addressed by employing a machine learning algorithm that may develop a model for speed estimation during a period of time when voltage measurements are available. This model may then be used once the voltage measurements become unavailable to estimate the speed of the motor. The different methods used to address these three scenarios may be explained in additional detail below. In certain embodiments of the disclosure, systems and methods can provide technical solutions for changing operation of a motor base at least in part on determining voltage values for the motor (which may then be used to estimate a speed of the motor) when complete voltage measurements may not be available, or may only be temporarily available.

With respect to the first scenario, and as mentioned above, three phase voltage measurements may be derived even when only single phase voltage measurements are available through pseudo-voltage calculations. The pseudo three phase voltage values may be derived from any one VT source (for example, a single phase voltage measurement) by considering all three phases as being associated with a balanced three phase system (for example, all three phase voltages and currents may be the same magnitude and may also be equally spaced apart with individual phases, such as about 120 degrees separation between the three phases). For example, if the magnitude of one phase is about 110V, then the magnitude of the other two phases may also be about 110V as well. Since the pseudo three phase voltage calculation may rely on a balanced power system, the calculation accuracies may be influenced by system unbalance conditions. In the case of a perfectly balanced system, the calculated pseudo-voltages may be the same as actual system voltages. However, the errors in three phase power and energy calculation may increase as unbalance in the system increases. The generated three phase voltages (for example, the pseudo-voltage calculations) from a single phase reference input may be used for calculating the three phase metering quantities.

In some embodiments, pseudo-voltage calculations as described above may be enabled only when the VT connection type is "single," and may be disabled when the VT connection type is "wye" or "delta." The pseudo-voltage calculations (for example, $V_A$, $V_B$, and $V_C$) may more specifically be derived using a pseudo-voltage reference table below, which may be similar to Table 1 provided below. The table may provide pu phase and line voltage magnitudes and angles for different phase rotations or phase sequences for calculating pseudo voltages. Multipliers specified in the table may be used. Line to ground voltages (for example, $V_{AG}$, $V_{BG}$, $V_{CG}$, may be calculated considering the VT connection as balanced, and these values may be used for the voltage and other elements. Further, line-to-line voltages (for example, $V_{AB}$, $V_{BC}$, $V_{CA}$) may be calculated by considering the VT connection as balanced connection as well. These calculated three phase voltage values ($V_A$, $V_B$, $V_C$) may then be used for three phase power metering (determining an input power of the motor) because current measurements may be readily available. Using the power computed considering balanced system, the speed of the motor may then be estimated. Once the speed is determined, it may also be used to compute fault frequencies for the motor and magnitudes for ESA along with motor nameplate/design information.

The DQC may ensure that an acquired electrical waveform is stable for ESA analysis purposes. The DQC may involve the following example operations. First, current unbalance may be used to indirectly judge voltage unbalance in the system. Second, voltage total harmonic distortion (THD) and voltage magnitude limits check may be performed on the single phase VT voltage. Third, a current THD may be checked on the same phase where the single phase VT voltage is available. Fourth, current and voltage THD values may be used to judge whether a Fast Fourier Transform (FFT) computation on the phase is feasible. A phase that has less harmonics and unbalance may be considered. If so, the FFT on phase current is performed for same phase where the single phase VT voltage is available. Finally, it may be determined if a voltage to frequency ratio for the single phase VT voltage is constant for variable-frequency drive (VFD) operation to ensure speed estimation accuracy.

As speed estimation accuracy considering a balanced system operation may produce speed error, vicinity checks may also be performed for additional FFT resolution points (additional frequency values) around both sides of a computed fault frequency of the motor. The number of frequency values that may be considered around the determined fault frequency of the motor may be based on a product of a harmonic factor and a rotational frequency (Fr), which may be equal to Nr/60, where Nr may be a speed in rpm. This may be used to extract accurate fault magnitudes in FFT for a given type of motor fault. As speed estimation error increases with higher harmonic factors (k) of fault, the decision to include specific harmonic factors may be checked adaptively and only genuine or limited fault frequencies within possible vicinity check may be identified for fault analysis. Based on the baseline data during baseline period, a standard deviation may be computed (with a single phase VT option) eliminating possible outliers. Threshold levels for fault magnitudes will be updated accordingly as multiples of baseline standard deviation and considering

TABLE 1

| Pseudo 3 Phase Voltage Type | Calculated 3 Phase Voltages | | | | | |
|---|---|---|---|---|---|---|
| | ABC Rotation | | | ACB Rotation | | |
| (Reference Voltage) | $V_{AG}$ | $V_{BG}$ | $V_{CG}$ | $V_{AG}$ | $V_{BG}$ | $V_{CG}$ |
| $V_A$ | 1∠0° | 1∠−120° | 1∠120° | 1∠0° | 1∠120° | 1∠−120° |
| $V_B$ | 1∠120° | 1∠0° | 1∠−120° | 1∠−120° | 1∠0° | 1∠120° |
| $V_C$ | 1∠−120° | 1∠120° | 1∠0° | 1∠120° | 1∠−120° | 1∠0° |
| $V_{AB}$ | 1/√3 ∠−30° | 1/√3 ∠−150° | 1/√3 ∠90° | 1/√3 ∠30° | 1/√3 ∠150° | 1/√3 ∠−90° |
| $V_{BC}$ | 1/√3 ∠90° | 1/√3 ∠−30° | 1/√3 ∠−150° | 1/√3 ∠−90° | 1/√3 ∠30° | 1/√3 ∠150° |
| $V_{CA}$ | 1/√3 ∠−150° | 1/√3 ∠90° | 1/√3 ∠−30° | 1/√3 ∠150° | 1/√3 ∠−90° | 1/√3 ∠30° |

In some cases, the motor speed may be determined using Equation 1 presented below.

$$\text{Motor speed in } rpm = Ns - \left[\left(\frac{Pin_{bal}}{Pin_{rated}}\right) * \text{Rated slip speed}\right] \quad \text{(Equation 1)}$$

where Ns may be equal to a synchronous speed of the motor, $Pin_{bal}$ may be equal to a determined input power of the motor (for example, the input power that may be determined as described above), and $Pin_{rated}$ may be equal to a rated input power of the motor.

In some embodiments, a data quality check (DQC) may be performed in association with the above first scenario.

tolerances for power (speed) estimation, fault frequency, NPI inaccuracies for accurate fault diagnosis and condition reporting.

With respect to the second scenario (for example, when no voltage measurements are available), speed estimation for the motor may be performed using Equation 2 below.

$$\text{Motor Speed} = (\text{Synch Speed}) - ((xFLA/1.00) * (\text{Rated Slip speed})) \quad \text{(Equation 2)}$$

where synch speed may be equal to 120*Fs/P (where Fs may be a measured frequency and 'P' may be a number of poles of the motor), xFLA may be a load factor (which may be a value that is <1.00) computed in metering, the rated slip speed may be equal to [(synch speed)−(rated speed)], synch speed may be computed as above, and rated speed may be acquired from motor nameplate settings. In some cases, the speed values may be in units of rotations per minute (RPM).

Once the speed is computed, the determined speed may need to be rounded off to the nearest integer (for example, if the computed speed is XXXX.YY, and if YY<0.50 then speed may be rounded off to XXXX and if YY≥0.50 then speed should be rounded off to XXXX+1). Additionally, in situations of motor overload condition where xFLA>1.00, then the motor speed may be considered as the "rated speed" itself.

In some embodiments, the speed of the motor may also be calculated using Equations 3 and 4 below as well.

$$\text{Motor speed} = \text{sync speed} - \left|\frac{Itrq}{Itrq_{rated}}\right| * \text{rated\_slip\_speed} \quad \text{(Equation 3)}$$

where $Itrq=\text{sqrt}(Irms^2-Imn_{rated}^2)$, $Itrq_{rated}=\text{sqrt}(Irated^2-Imn_{rated}^2)$, where Itrq may be equal to the torque current of the motor, Irms may be equal to the root mean square current of the motor, $Imn_{rated}$ may be equal to a rated magnetizing current component of the motor, and $Itrq_{rated}$ may be equal to a rated torque current of the motor.

$$\text{Motor speed} = \frac{xFLA}{\text{Rated } FLA} = \frac{\text{Motor Load Current}}{\text{Full Load Current}} \quad \text{(Equation 4)}$$

In some embodiments, a data quality check (DQC) may be performed in association with the above first scenario. The DQC may ensure that an acquired electrical waveform is stable for ESA analysis purposes. The DQC may involve the following operations, for example. First, current unbalance may be used to indirectly judge voltage unbalance in the system. Second, current THD may be checked on the phase where FFT is computed.

As speed estimation accuracy considering a balanced system operation may produce speed error, vicinity checks may also be performed for an additional FFT resolution points (additional frequency values) around both sides of a computed fault frequency of the motor. The number of frequency values that may be considered around the determined fault frequency of the motor may be based on a product of a harmonic factor and a rotational frequency (Fr), which may be equal to Nr/60, where Nr may be a speed in rpm. This may be used to extract accurate fault magnitudes in FFT for a given type of motor fault. As speed estimation error increases with higher harmonic factors (k) of fault, the decision to include specific harmonic factors may be checked adaptively and only genuine or limited fault frequencies within possible vicinity check may be identified for fault analysis. Based on the baseline data during baseline period, a standard deviation may be computed (with a single phase VT option) eliminating possible outliers. Threshold levels for fault magnitudes will be updated accordingly as multiples of baseline standard deviation and considering tolerances for power (speed) estimation, fault frequency, NPI inaccuracies for accurate fault diagnosis and condition reporting.

With respect to the third scenario (for example, when voltage measurements are only available for a limited period of time, such as during installation of the motor), an adaptive learning model may be established for speed estimation. The adaptive model may be established by considering voltage, frequency, load, and power inputs (as well as any other inputs) to estimate speed using any available machine learning technique, including, but not limited to, linear regression, polynomial regression, ANN, Random forest, or any other machine learning technique. Once the model is built for each load bin of the motor based on load characteristics, the same model may then be used for estimating the speed during a monitoring mode when the voltage measurements are no longer available. That is, a machine learning model for estimating motor speed may be trained during a period of time when inputs and speed outputs are available, and then the model may subsequently be used to perform speed estimations when the measurements are no longer available.

In some embodiments, speed estimation model may also work with the methods described with respect to the second scenario to build more accurate speed estimation technique where a factor 'a' (shown in Equation 5 below) range is identified and learned for each 10% load bin operation before the beginning of baseline period. This may be performed during relay installation by connecting an auxiliary voltage source for some time to build a model under various load conditions so that speed can be used during baseline and monitoring modes.

$$\text{Motor speed} = \text{Sync speed} - \left|a * \frac{Irated}{Irated}\right| * \text{rated\_slip\_speed} \quad \text{(Equation 5)}$$

Turning to the figures, FIG. 1 illustrates an example system 100 according to one or more embodiments of the disclosure. The system 100 may be a power system including one or more power assets. The one or more power assets may include at least a protection relay 102, a supply 104, an electrical machine 106, and/or a load 108. The protection relay may be an intelligent protection relay that may provide relatively high performance protection, high density inputs and outputs (I/O), extensive programmable logic, and flexible configuration capabilities. With protection and control logic, such a protection relay 102 may allow for relatively simplified coordination with upstream and downstream disconnect devices (e.g., one or more electrical machines 106 within the system 100). The protection relay 102 may itself also have the capability to monitor and capture data produced by the one or more electrical machines 106. It should be noted, however, that, in some cases, the algorithm may be implemented on a remote server instead of being implemented on a local device such as a protection relay 102. That is, data may be captured and transmitted to the remote server for analysis. In some cases, the data may be captured in the time domain and converted into the frequency domain for analysis. The supply 104 may be a power supply connected to the electrical machine 106 that may be used to provide power to the electrical machine 106. The electrical machine 106 may be, for example, an induction or synchronous motor, as well as any other type of electrical machine. In some cases, the electrical machine may specifically involve a variable frequency drive (VFD) motor, or any other type of motor. The load 108 may be any system that is powered by the electrical machine.

Figure 2:
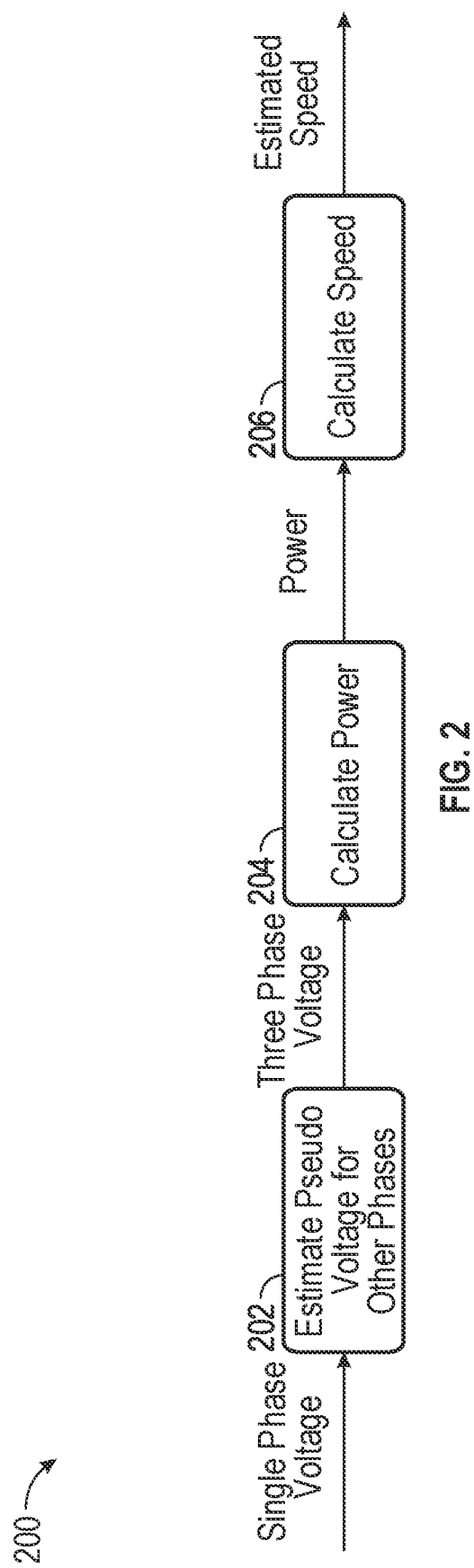
FIG. 2 depicts an example flow diagram, in accordance with one or more example embodiments of the disclosure.

FIG. 2 depicts an example flow diagram 200, in accordance with one or more embodiments of this disclosure. In some cases, the flow diagram 200 may illustrate an example logical low of operations corresponding to the first scenario mentioned above. That is, the flow diagram 200 may present an example logical flow of operations for a scenario where only single phase voltage measurements for a three phase motor (for example, the electrical machine 106 in FIG. 1).

In some cases, the flow diagram 200 may initiate with operation 202, which may involve estimating pseudo-voltages for the other two remaining phases when only a single phase voltage measurement is available. The pseudo-voltage calculations may more specifically be derived as follows. First, $V_A$, $V_B$, and $V_C$ may be determined using a pseudo-voltage reference table below, which may be similar to Table 1 provided below. Multipliers specified in the table may be used. Line to ground voltages (for example, $V_{AG}$, $V_{BG}$, $V_{CG}$, may be calculated considering the VT connection as balanced, and these values may be used for the voltage and other elements. Further, line-to-line voltages (for example, $V_{AB}$, $V_{BC}$, $V_{CA}$) may be calculated by considering the VT connection as balanced connection as well. The pseudo three phase voltage values may be derived from any one VT source (for example, that may provide a single phase measurement) by considering the three phase voltage as being associated with a balanced three phase system (for example, all three phase voltages and currents may be the same magnitude and may also be equally spaced apart with individual phases, such as 120 degrees separation between the three phases). Since, the pseudo three phase voltage calculation may rely on a balanced power system, the calculation accuracies may be influenced by system unbalance conditions. From operation 202, the flow diagram 200 may proceed to operation 204, which may involve calculating an input power of the motor based on the pseudo-voltages calculated in operation 204. The calculated three phase voltage values ($V_A$, $V_B$, $V_C$) may then be used for three phase power metering (determining an input power of the motor) because current measurements may be readily available. From operation 204, the flow diagram 200 may proceed to operation 206, which may involve calculating a speed of the motor based on the power determined in operation 204. Using the power computed considering balanced system, the speed of the motor may then be estimated. Once the speed is determined, it may also be used to compute fault frequencies for the motor and magnitudes for ESA along with motor nameplate/design information. In some cases, the speed of the motor may be determined using Equation 1 presented above.

Figure 3:
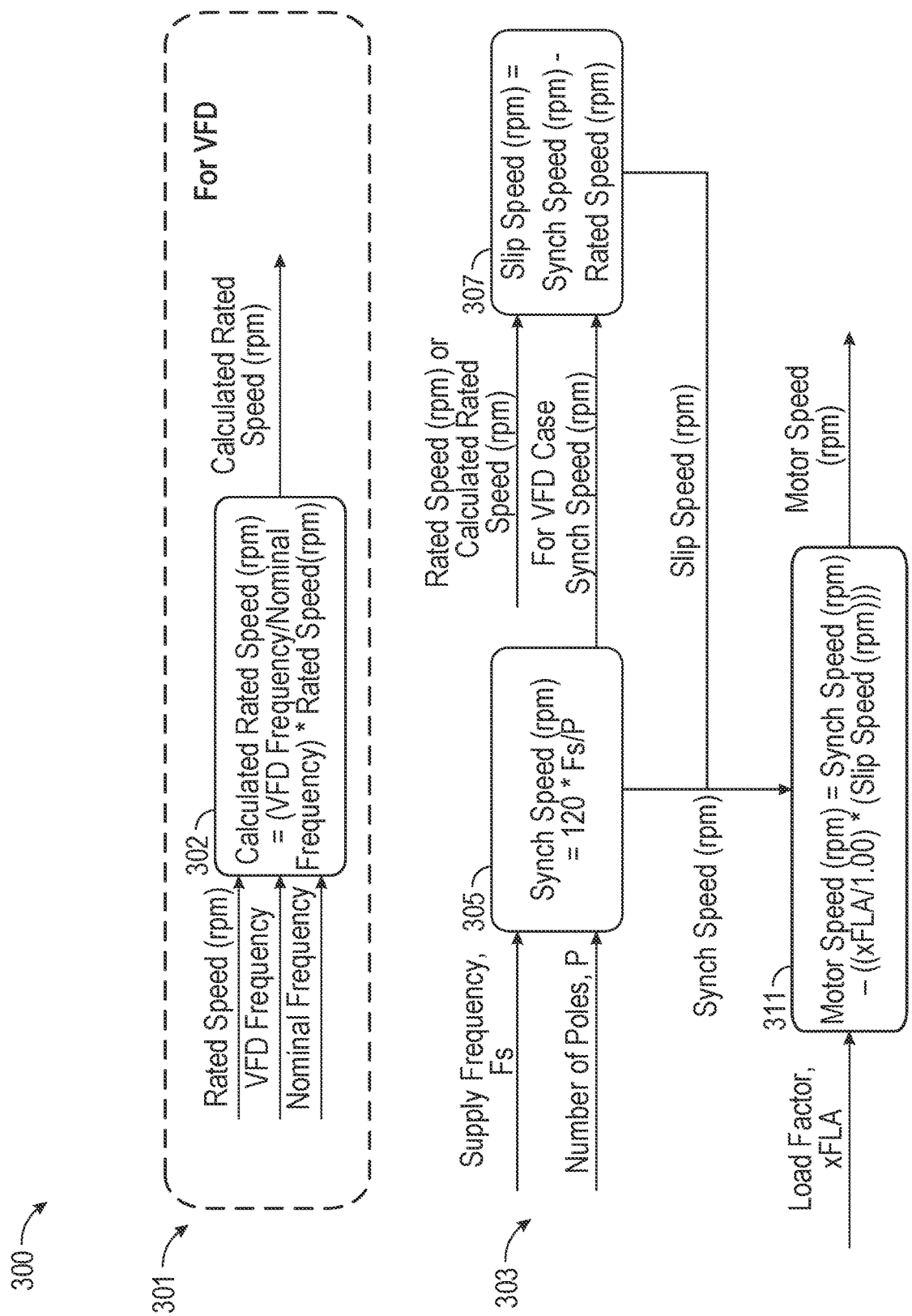
FIG. 3 depicts another example flow diagram, in accordance with one or more example embodiments of the disclosure.

FIG. 3 depicts an example flow diagram 300, in accordance with one or more embodiments of this disclosure. In some cases, the flow diagram 300 may illustrate an example logical low of operations corresponding to the second scenario mentioned above. That is, the flow diagram 300 may present an example logical flow of operations for a scenario where no voltage measurements are available for the motor. The flow diagram 300 may include two separate logical flows. A first logical flow 301 may represent operations that may be performed when the motor is a VFD, and a second logical flow 303 may represent operations that may be performed otherwise.

In some embodiments, as illustrated in the first logical flow 301, a speed of a VFD may be determined based on a frequency of the VFD, a nominal frequency, and a rated speed. More specifically, the speed of the VFD may be determined using Equation 6 presented below.

$$\text{Speed} = \left(\frac{VFD \text{ frequency}}{\text{nominal frequency}} * \text{rated speed}\right) \quad \text{(Equation 6)}$$

In some embodiments, the logical flow 303 may begin at operation 305, which may involve determining a synchronous speed of the motor. The synchronous speed of the motor may be equal to 120*Fs/P (where Fs may be a measured frequency and 'P' may be a number of poles of the motor). From operation 305, the logical flow 303 may proceed to operation 307, which may involve determining a slip speed of the motor. The slip speed of the motor may be determined using the synchronous speed calculated in operation 305 and the rated speed of the motor. More specifically, the slip speed of the motor may be calculated as the difference between the synchronous speed and the rated speed of the motor. The synchronous speed determined in operation 305 and the slip speed determined in operation 307 may be provided as inputs to operation 311, which may involve determining the speed of the motor. The speed of the motor may be determined in operation 311 using Equation 2 presented above.

Figure 4:
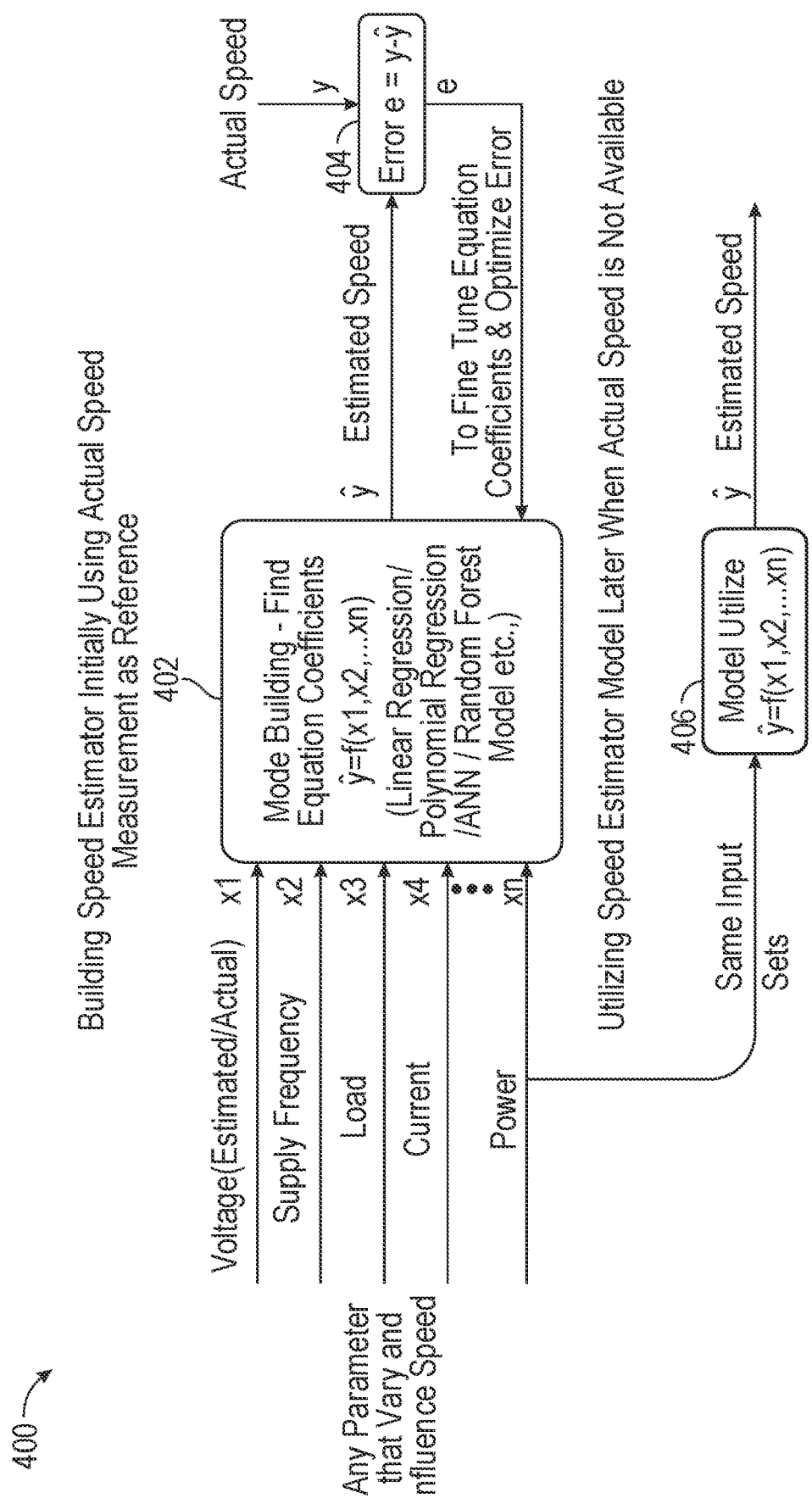
FIG. 4 depicts another example flow diagram, in accordance with one or more example embodiments of the disclosure.

FIG. 4 depicts an example flow diagram 400, in accordance with one or more embodiments of this disclosure. In some cases, the flow diagram 400 may illustrate an example logical low of operations corresponding to the third scenario mentioned above. The flow diagram 400 may begin with operation 402, which may involve building a correlation model that may be used to estimate a speed of a motor given a set of inputs associated with the motor. In some cases, the operation 402 (and the operation 404 described below) may occur during a "baselining" mode. The baselining mode may refer to a period of time during which voltage measurements may be available from the motor (for example, during installation of the motor or during a learning phase of the motor). The model may be an adaptive model (which may mean that the model may change over time based on additional input data received during the baselining mode). The model may be established by considering inputs such as voltage, frequency, load, and power inputs (as well as any other inputs). Additionally, the model may be established using any type of machine learning techniques, including, but not limited to, linear regression, polynomial regression, ANN, Random forest, or any other machine learning technique. Also during the baselining mode, operation 404 may involve receiving an estimated speed input (for example, an estimated speed of the motor determined using the model in operation 402) and receiving an actual speed of the motor (which may be determined using measured power input data from the motor or measured directly from tachometer sensor), and determining an amount of error in the speed estimation performed using the model in operation 402. The amount of error may be based on a difference between the estimated speed and the actual speed. Based on the amount of error determined in operation 404, the flow diagram 400 may return to operation 402 and modify the model to improve speed estimates produced by the model. In this manner, the operation 402 and 404 may iterate any number of given times throughout the baselining mode (that is, the model may continue to be improved while voltage measurements are still available from the motor). Following the baselining mode, the flow diagram 400 may proceed to operation 406, which may involve utilizing the model developed in the baselining mode (for example, operations 402 and 404) to estimate a speed of the motor when voltage measurements are no longer available. That is, when provided with a given set of inputs that may include measurements performed with respect to the motor, the model may be capable of producing a speed estimation for the motor as an output.

Figure 5:
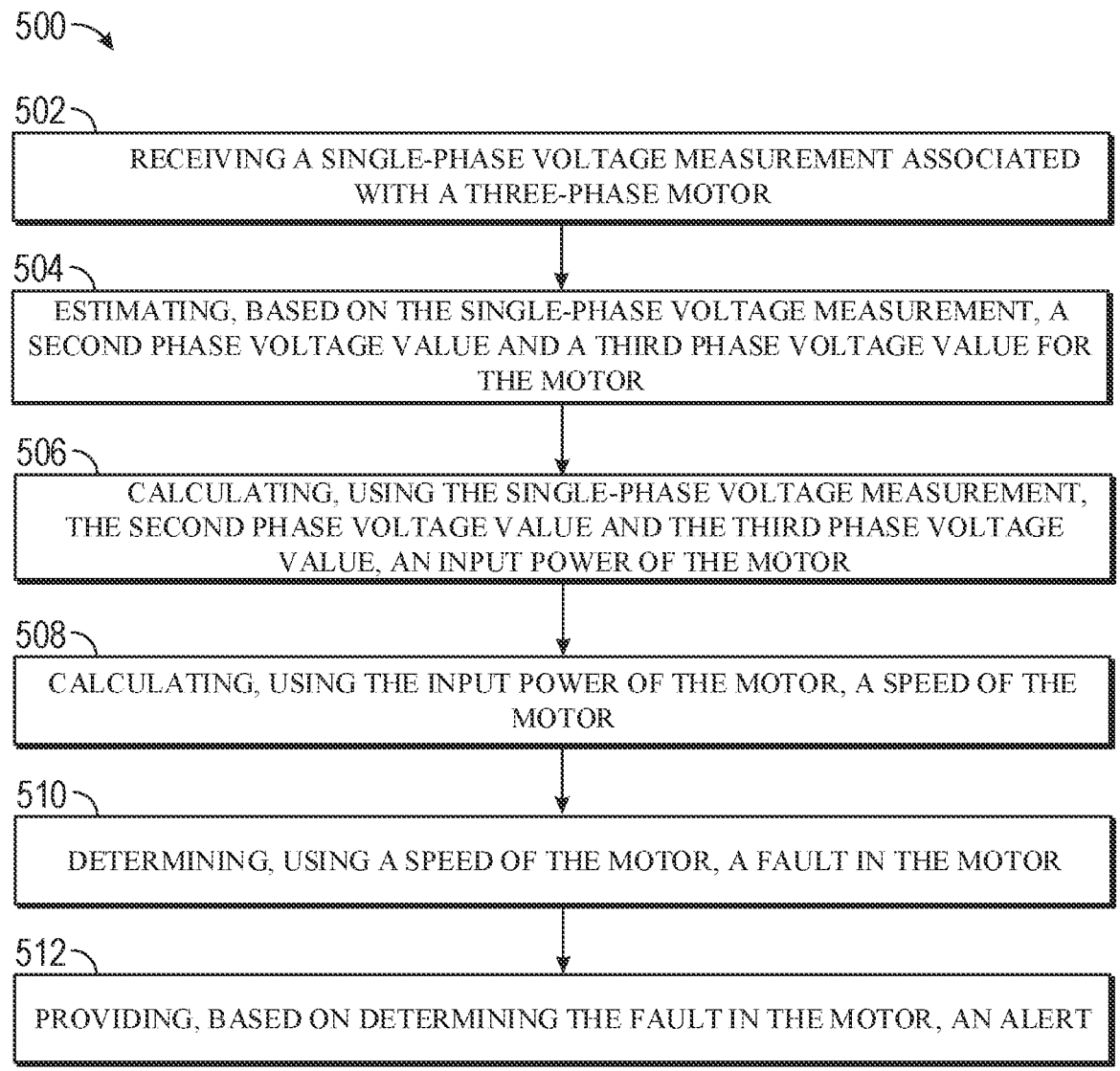
FIG. 5 depicts an example method, in accordance with one or more example embodiments of the disclosure.

FIG. 5 depicts an example method 500, in accordance with one or more embodiments of this disclosure. The method 500 may correspond with the first scenario as described above. At block 502 in FIG. 5, the method 500 may include receiving a single-phase voltage measurement associated with a three-phase motor. Block 504 may include estimating, based at least in part on the single-phase voltage measurement, a second phase voltage value and a third phase voltage value for the motor. In some embodiments, estimating the second phase voltage value and the third phase voltage value is performed based at least in part on a magnitude of the second phase voltage value and a magnitude of the third phase voltage value both being equal to a magnitude of the single-phase voltage measurement, and based at least in part on the single-phase voltage measurement, second phase voltage value, and the third phase voltage value being all being separated equally by 120 degrees. In some embodiments, estimating the second phase voltage value and the third phase voltage value for the motor is further based at least in part on a reference table, wherein the reference table includes one or more line-to-line voltage values and one or more line-to-ground voltage values. Block 506 may include calculating, based at least in part on the single-phase voltage measurement, the second phase voltage value, and the third phase voltage value, an input power of the motor. Block 508 may include calculating, based at least in part on the input power of the motor, a speed of the motor. In some embodiments, calculating the speed of the motor is based at least in part on a difference between a first value and a product of a second value and a third value, wherein the first value is a synchronous speed of the motor, wherein the second value is an absolute value of a ratio between a balanced input power and a rated input power, and wherein the third value is a rated slip speed of the motor. Block 510 may include determining, based at least in part on the speed of the motor, a fault in the motor. Block 512 may include performing, based at least in part on determining the fault in the motor, a control action comprising at least generating an alert. In certain embodiments, the control action can further comprise changing an operation of the motor, such as changing the speed of the motor.

In some embodiments, the method 500 may further comprising performing a data quality check comprising at least determining voltage unbalance using current unbalance data, performing a voltage total harmonic distortion (THD) and voltage magnitude limit check for a given phase, performing a current THD for the given phase, performing, based at least in part on the voltage THD and current THD, a Fast Fourier Transform (FFT) on current data for the given phase, and/or determining that a voltage to frequency ratio is constant.

In some embodiments, the method 500 may also include identifying, based at least in part on the speed of the motor, a fault frequency associated with a type of fault of the motor. In some embodiments, identifying the fault frequency further comprises analyzing frequencies within a range of the fault frequency, wherein the range is based at least in part on a harmonic factor value. In some embodiments, the harmonic factor value is adaptive based at least in part on an amount of speed estimation error produced when the harmonic factor value is above a threshold value.

Figure 6:
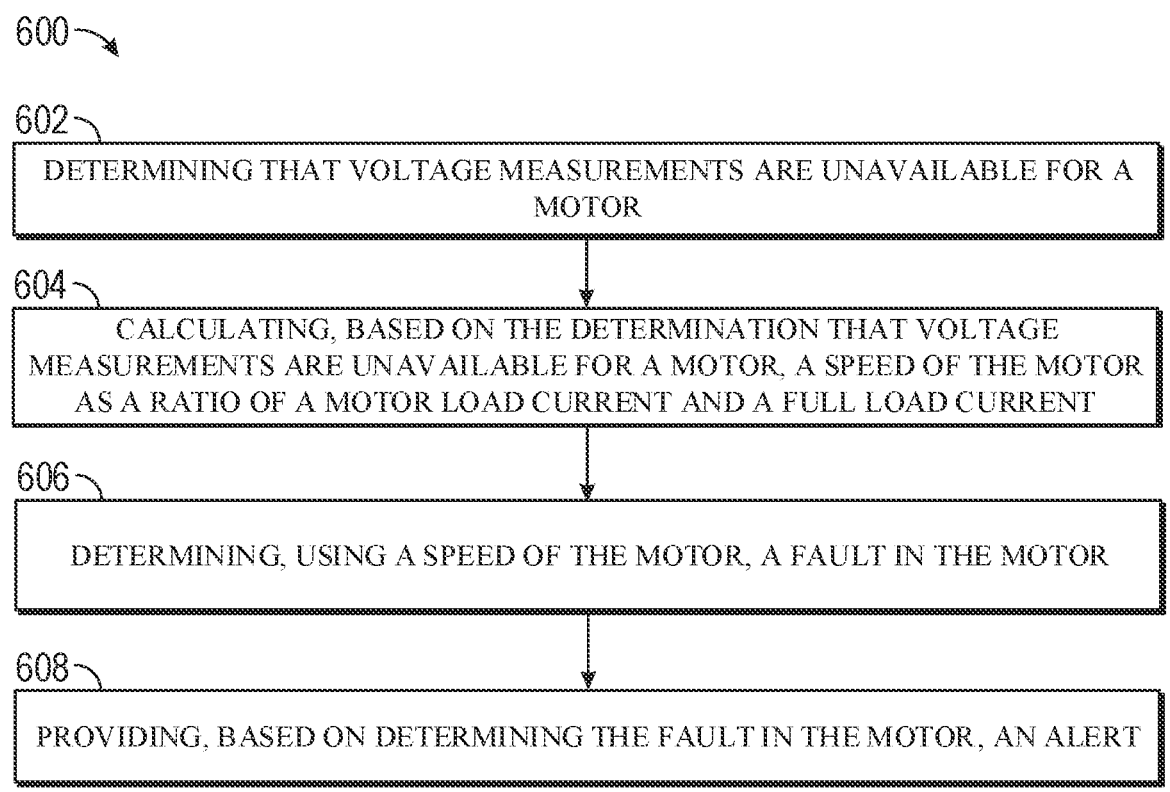
FIG. 6 depicts another example method, in accordance with one or more example embodiments of the disclosure.

FIG. 6 depicts an example method 600, in accordance with one or more embodiments of this disclosure. The method 600 may correspond with the second scenario as described above. At block 602 in FIG. 6, the method 600 may include determining that voltage measurements are unavailable for a motor. At block 604, the method 600 may include calculating, based at least in part on the determination that voltage measurements are unavailable for a motor, a speed of the motor as a ratio of a motor load current and a full load current. In some embodiments, calculating the speed of the motor is alternatively based at least in part on a difference between a first value and a product of a second value and a third value, wherein the first value is a synchronous speed of the motor, wherein the second value is an absolute value of a ratio between a torque current and a rated torque current, and wherein the third value is a rated slip speed of the motor. At block 606, the method may include determining, based at least in part on a speed of the motor, a fault in the motor. At block 608, the method may include performing, based at least in part on determining the fault in the motor, a control action comprising at least generating an alert. In certain embodiments, the control action can further comprise changing an operation of the motor, such as changing the speed of the motor.

In some embodiments, the synchronous speed of the motor is based at least in part on a ratio of a fundamental frequency of the motor and a number of poles of the motor. In some embodiments, the rated slip speed is based at least in part on a difference between a fourth value and a fifth value, wherein the fourth value is based at least in part on ratio of a fundamental frequency of the motor and a number of poles of the motor, and wherein the fifth value is a rated speed of the motor.

In some embodiments, the method 600 further comprising performing a data quality check comprising at least determining voltage unbalance using current unbalance data, performing a voltage total harmonic distortion (THD) and voltage magnitude limit check for a given phase, and/or performing a current THD for the given phase. In some embodiments, the method 600 may also include identifying, based at least in part on the speed of the motor, a fault frequency associated with a type of fault of the motor. In some embodiments, identifying the fault frequency further comprises analyzing frequencies within a range of the fault frequency, wherein the range is based at least in part on a harmonic factor value. In some embodiments, the harmonic factor value is adaptive based at least in part on an amount of speed estimation error produced when the harmonic factor value is above a threshold value.

Figure 7:
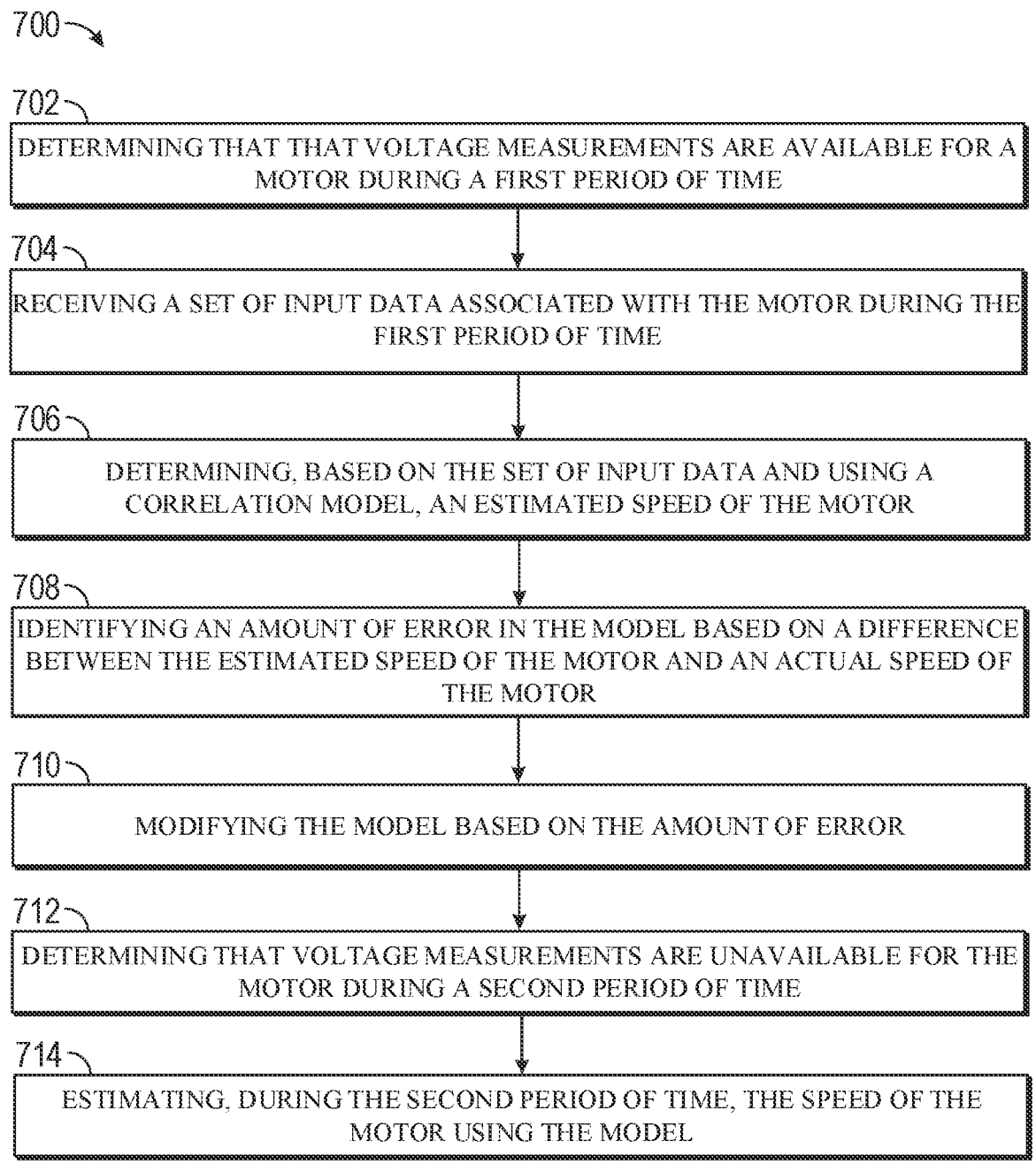
FIG. 7 depicts another example method, in accordance with one or more example embodiments of the disclosure.

FIG. 7 depicts an example method 700, in accordance with one or more embodiments of this disclosure. The method 700 may correspond with the third scenario as described above. At block 702 in FIG. 7, the method 700 may include determining that that voltage measurements are available for a motor during a first period of time. Block 704 may include receiving a set of input data associated with the motor during the first period of time. Block 706 may include determining, based at least in part on the set of input data and using a correlation model, an estimated speed of the motor. In some embodiments, the set of input data includes at least one of: voltage, supply frequency, load, current, and power. In some embodiments, the correlation model is a machine learning model. Block 708 may include identifying an amount of error in the model based at least in part on a difference between the estimated speed of the motor and an actual speed of the motor. Block 710 may include modifying the model based at least in part on the amount of error. Block 712 may include determining that voltage measurements are unavailable for the motor during a second period of time. Block 714 may include estimating, during the second period of time, the speed of the motor using the model. Block 716 may include performing, based at least in part on the speed of the motor, a control action comprising at least generating an alert. In certain embodiments, the control action can further comprise changing an operation of the motor, such as changing the speed of the motor.

The operations described and depicted in the illustrative process flow of FIGS. 2-7 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 2-7 may be performed.

Figure 8:
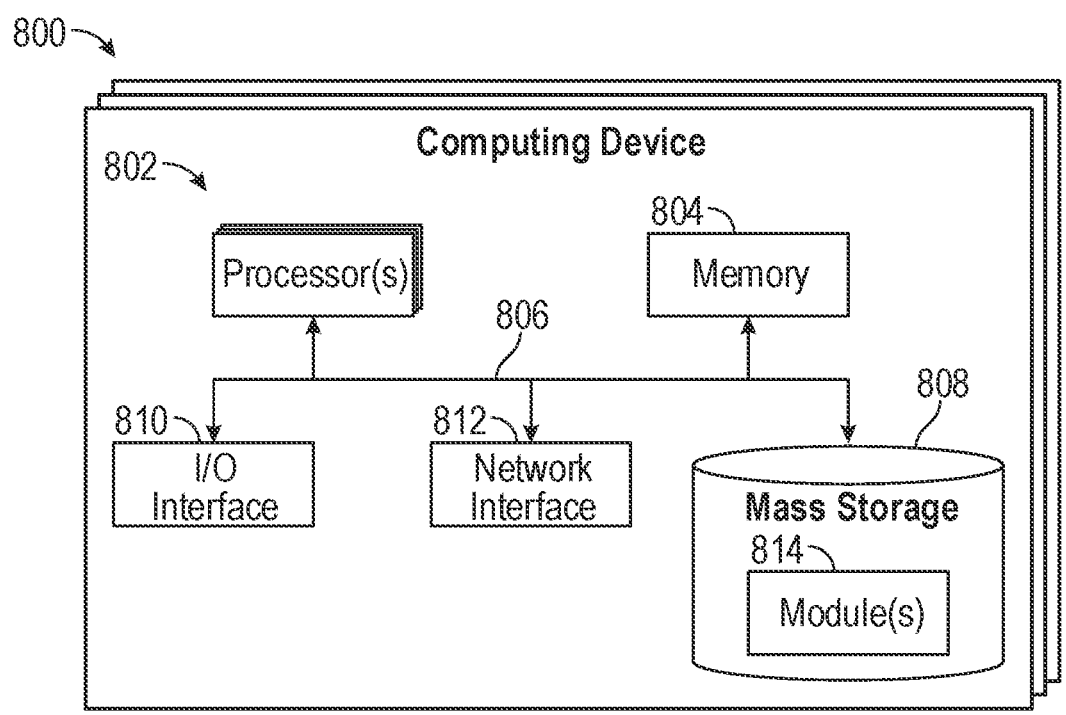
FIG. 8 depicts a schematic illustration of an example computing system and device architecture, in accordance with one or more example embodiments of the disclosure.

FIG. 8 illustrates an example computing system and device 800, in accordance with one or more embodiments of this disclosure. The computing device 800 may be representative of any number of elements described herein, such the protection relay 102, or any other element described herein. The computing device 800 may include one or more processors 802 that execute instructions that are stored in one or more memory devices (referred to as memory 804). The instructions can be, for instance, instructions for implementing functionality described as being carried out by one or more modules and systems disclosed above or instructions for implementing one or more of the methods disclosed above. The one or more processors 802 can be embodied in, for example, a CPU, multiple CPUs, a GPU, multiple GPUs, a TPU, multiple TPUs, a multi-core processor, a combination thereof, and the like. In some embodiments, the one or more processors 802 can be arranged in a single processing device. In other embodiments, the one or more processors 802 can be distributed across two or more processing devices (e.g., multiple CPUs; multiple GPUs; a combination thereof; or the like). A processor can be implemented as a combination of processing circuitry or computing processing units (such as CPUs, GPUs, or a combination of both). Therefore, for the sake of illustration, a processor can refer to a single-core processor; a single processor with software multithread execution capability; a multi-core processor; a multi-core processor with software multithread execution capability; a multi-core processor with hardware multithread technology; a parallel processing (or computing) platform; and parallel computing platforms with distributed shared memory. Additionally, or as another example, a processor can refer to an integrated circuit (IC), an ASIC, a digital signal processor (DSP), an FPGA, a PLC, a complex programmable logic device (CPLD), a discrete gate or transistor logic, discrete hardware components, or any combination thereof designed or otherwise configured (e.g., manufactured) to perform the functions described herein.

The one or more processors 802 can access the memory 804 by means of a communication architecture 806 (e.g., a system bus). The communication architecture 806 may be suitable for the particular arrangement (localized or distributed) and types of the one or more processors 802. In some embodiments, the communication architecture 806 can include one or many bus architectures, such as a memory bus or a memory controller; a peripheral bus; an accelerated graphics port; a processor or local bus; a combination thereof, or the like. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnect (PCI) bus, a PCI-Express bus, a Personal Computer Memory Card International Association (PCMCIA) bus, a Universal Serial Bus (USB), and/or the like.

Memory components or memory devices disclosed herein can be embodied in either volatile memory or non-volatile memory or can include both volatile and non-volatile memory. In addition, the memory components or memory devices can be removable or non-removable, and/or internal or external to a computing device or component. Examples of various types of non-transitory storage media can include hard-disc drives, zip drives, CD-ROMs, digital versatile disks (DVDs) or other optical storage, magnetic cassettes, magnetic tape, magnetic disk storage or other magnetic storage devices, flash memory cards or other types of memory cards, cartridges, or any other non-transitory media suitable to retain the desired information and which can be accessed by a computing device.

As an illustration, non-volatile memory can include read-only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory devices or memories of the operational or computational environments described herein are intended to include one or more of these and/or any other suitable types of memory. In addition to storing executable instructions, the memory 804 also can retain data.

Each computing device 800 also can include mass storage 808 that is accessible by the one or more processors 802 by means of the communication architecture 806. The mass storage 808 can include machine-accessible instructions (e.g., computer-readable instructions and/or computer-executable instructions). In some embodiments, the machine-accessible instructions may be encoded in the mass storage 808 and can be arranged in components that can be built (e.g., linked and compiled) and retained in computer-executable form in the mass storage 808 or in one or more other machine-accessible non-transitory storage media included in the computing device 800. Such components can embody, or can constitute, one or many of the various modules disclosed herein. Such modules are illustrated as modules 814. Additionally, protocols such as Modbus, DNP, IEC 60870, IEC 61850, Profibus, Fieldbus, etc. may be used in conjunction with the systems and methods described herein.

Execution of the modules 814, individually or in combination, by the one more processors 802, can cause the computing device 800 to perform any of the operations described herein (for example, the operations described with respect to FIG. 2-7, as well as any other operations).

Each computing device 800 also can include one or more input/output interface devices 810 (referred to as I/O interface 810) that can permit or otherwise facilitate external devices to communicate with the computing device 800. For instance, the I/O interface 810 may be used to receive and send data and/or instructions from and to an external computing device.

The computing device 800 also includes one or more network interface devices 812 (referred to as network interface(s) 812) that can permit or otherwise facilitate functionally coupling the computing device 800 with one or more external devices. Functionally coupling the computing device 800 to an external device can include establishing a wireline connection or a wireless connection between the computing device 800 and the external device. The network interface(s) 812 can include one or many antennas and a communication processing device that can permit wireless communication between the computing device 800 and another external device. For example, between a vehicle and a smart infrastructure system, between two smart infrastructure systems, etc. Such a communication processing device can process data according to defined protocols of one or several radio technologies. The radio technologies can include, for example, 3G, Long Term Evolution (LTE), LTE-Advanced, 5G, IEEE 802.11, IEEE 802.16, Bluetooth, ZigBee, near-field communication (NFC), and the like. The communication processing device can also process data according to other protocols as well, such as vehicle-to-infrastructure (V2I) communications, vehicle-to-vehicle (V2V) communications, and the like. The network interface(s) 812 may also be used to facilitate peer-to-peer ad-hoc network connections as described herein.

As used in this application, the terms "environment," "system," "unit," "module," "architecture," "interface," "component," and the like refer to a computer-related entity or an entity related to an operational apparatus with one or more defined functionalities. The terms "environment," "system," "module," "component," "architecture," "interface," and "unit," can be utilized interchangeably and can be generically referred to functional elements. Such entities may be either hardware, a combination of hardware and software, software, or software in execution. As an example, a module can be embodied in a process running on a processor, a processor, an object, an executable portion of software, a thread of execution, a program, and/or a computing device. As another example, both a software application executing on a computing device and the computing device can embody a module. As yet another example, one or more modules may reside within a process and/or thread of execution. A module may be localized on one computing device or distributed between two or more computing devices. As is disclosed herein, a module can execute from various computer-readable non-transitory storage media having various data structures stored thereon. Modules can communicate via local and/or remote processes in accordance, for example, with a signal (either analogic or digital) having one or more data packets (e.g., data from one component interacting with another component in a local system, distributed system, and/or across a network such as a wide area network with other systems via the signal).

As yet another example, a module can be embodied in or can include an apparatus with a defined functionality provided by mechanical parts operated by electric or electronic circuitry that is controlled by a software application or firmware application executed by a processor. Such a processor can be internal or external to the apparatus and can execute at least part of the software or firmware application. Still, in another example, a module can be embodied in or can include an apparatus that provides defined functionality through electronic components without mechanical parts. The electronic components can include a processor to execute software or firmware that permits or otherwise facilitates, at least in part, the functionality of the electronic components.

In some embodiments, modules can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, modules can communicate or otherwise be coupled via thermal, mechanical, electrical, and/or electro-mechanical coupling mechanisms (such as conduits, connectors, combinations thereof, or the like). An interface can include input/output (I/O) components as well as associated processors, applications, and/or other programming components.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (e.g., computer-readable instructions), information structures, program modules, or other information objects.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, techniques, and computer program products that, individually and in combination, permit the automated provision of an update for a vehicle profile package. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

That which is claimed is:

1. A method comprising:
 receiving a single-phase voltage measurement associated with a three-phase motor;
 estimating, based at least in part on the single-phase voltage measurement, a second phase voltage value and a third phase voltage value for the motor;
 calculating, based at least in part on the single-phase voltage measurement, the second phase voltage value, and the third phase voltage value, an input power of the motor;
 inputting the input power of the motor, the single-phase voltage measurement, the second phase voltage value, and the third phase voltage value as inputs to a machine learning model configured to generate estimated speeds of the motor based on the inputs;

generating, using the machine learning model, based at least in part on the inputs, a first estimated speed of the motor;

determining a difference between the first estimated speed of the motor and an actual speed of the motor;

inputting the difference to the machine learning model;

generating, using the machine learning model, based at least in part on the first estimated speed of the motor and the difference, a second estimated speed of the motor;

determining, based at least in part on the second estimated speed of the motor, a fault in the motor; and performing, based at least in part on determining the fault in the motor, a control action comprising at least generating an alert.

2. The method of claim 1, wherein generating the first estimated speed of the motor is based at least in part on a difference between a first value and a product of a second value and a third value, wherein the first value is a synchronous speed of the motor, wherein the second value is an absolute value of a ratio between a balanced input power and a rated input power, and wherein the third value is a rated slip speed of the motor.

3. The method of claim 1, wherein estimating the second phase voltage value and the third phase voltage value is performed based at least in part on a magnitude of the second phase voltage value and a magnitude of the third phase voltage value both being equal to a magnitude of the single-phase voltage measurement, and based at least in part on the single-phase voltage measurement, second phase voltage value, and the third phase voltage value being all being separated equally by 120 degrees.

4. The method of claim 1, wherein estimating the second phase voltage value and the third phase voltage value for the motor is further based at least in part on a reference table, wherein the reference table includes one or more line-to-line voltage values and one or more line-to-ground voltage values.

5. The method of claim 1, further comprising performing a data quality check comprising:
   determining voltage unbalance using current unbalance data;
   performing a voltage total harmonic distortion (THD) and voltage magnitude limit check for a given phase;
   performing a current THD for the given phase;
   performing, based at least in part on the voltage THD and current THD, a Fast Fourier Transform (FFT) on current data for the given phase; and determining that a voltage to frequency ratio is constant.

6. The method of claim 1, further comprising identifying, based at least in part on the second estimated speed of the motor, a fault frequency associated with a type of fault of the motor.

7. The method of claim 6, wherein identifying the fault frequency further comprises analyzing frequencies within a range of the fault frequency, wherein the range is based at least in part on a harmonic factor value.

8. The method of claim 7, wherein the harmonic factor value is adaptive based at least in part on an amount of speed estimation error produced when the harmonic factor value is above a threshold value.

9. A method comprising:
   determining that voltage measurements are unavailable for a motor;
   inputting a motor load current and a full load current as inputs to a machine learning model configured to generate estimated speeds of the motor based on the inputs;
   generating, using the machine learning model, based at least in part on the determination that voltage measurements are unavailable for a motor, a first estimated speed of the motor as a ratio of a motor load current and a full load current;
   determining a difference between the first estimated speed of the motor and an actual speed of the motor;
   inputting the difference to the machine learning model;
   generating, using the machine learning model, based at least in part on the first estimated speed of the motor and the difference, a second estimated speed of the motor;
   determining, based at least in part on the second estimated speed of the motor, a fault in the motor; and
   performing, based at least in part on determining the fault in the motor, a control action comprising at least generating an alert.

10. The method of claim 9, wherein generating the first estimated speed of the motor is alternatively based at least in part on a difference between a first value and a product of a second value and a third value, wherein the first value is a synchronous speed of the motor, wherein the second value is an absolute value of a ratio between a torque current and a rated torque current, and wherein the third value is a rated slip speed of the motor.

11. The method of claim 10, wherein the synchronous speed of the motor is based at least in part on a ratio of a fundamental frequency of the motor and a number of poles of the motor.

12. The method of claim 10, wherein the rated slip speed is based at least in part on a difference between a fourth value and a fifth value, wherein the fourth value is based at least in part on ratio of a fundamental frequency of the motor and a number of poles of the motor, and wherein the fifth value is a rated speed of the motor.

13. The method of claim 9, further comprising performing a data quality check comprising:
   determining voltage unbalance using current unbalance data;
   performing a voltage total harmonic distortion (THD) and voltage magnitude limit check for a given phase; and
   performing a current THD for the given phase.

14. The method of claim 9, further comprising identifying, based at least in part on the second estimated speed of the motor, a fault frequency associated with a type of fault of the motor.

15. The method of claim 14, wherein identifying the fault frequency further comprises analyzing frequencies within a range of the fault frequency, wherein the range is based at least in part on a harmonic factor value.

16. The method of claim 15, wherein the harmonic factor value is adaptive based at least in part on an amount of speed estimation error produced when the harmonic factor value is above a threshold value.

17. A method comprising:
   determining that voltage measurements are available for a motor during a first period of time;
   receiving a set of input data associated with the motor during the first period of time;
   inputting the set of input data to a machine learning model configured to generate estimated speeds of the motor based on the set of input data;

generating, using the machine learning model, based at least in part on the set of input data, a first estimated speed of the motor;

determining a difference between the estimated speed of the motor and an actual speed of the motor;

modifying the machine learning model based at least in part on the difference;

determining that voltage measurements are unavailable for the motor during a second period of time;

generating, during the second period of time, a second estimated speed of the motor using the modified machine learning model; and performing, based at least in part on the second estimated speed of the motor, a control action comprising at least generating an alert.

18. The method of claim 17, wherein the set of input data includes at least one of:

voltage, supply frequency, load, current, and power.

19. The method of claim 17, wherein the machine learning model is a correlation model.

20. The method of claim 17, wherein the control action further comprises changing operation of the motor.

\* \* \* \* \*